(12) United States Patent
Mrugalski et al.

(10) Patent No.: US 9,933,485 B2
(45) Date of Patent: Apr. 3, 2018

(54) DETERMINISTIC BUILT-IN SELF-TEST BASED ON COMPRESSED TEST PATTERNS STORED ON CHIP AND THEIR DERIVATIVES

(71) Applicant: Mentor Graphics Corporation, Wilsonville, OR (US)

(72) Inventors: Grzegorz Mrugalski, Swarzedz (PL); Janusz Rajski, West Linn, OR (US); Lukasz Rybak, Poznan (PL); Jedrzej Solecki, Poznan (PL); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 22 days.

(21) Appl. No.: 15/051,063

(22) Filed: Feb. 23, 2016

(65) Prior Publication Data
US 2016/0245863 A1  Aug. 25, 2016

Related U.S. Application Data

(60) Provisional application No. 62/119,943, filed on Feb. 24, 2015.

(51) Int. Cl.
*G01R 31/3187* (2006.01)
*G01R 31/3185* (2006.01)

(52) U.S. Cl.
CPC .. *G01R 31/3187* (2013.01); *G01R 31/318547* (2013.01)

(58) Field of Classification Search
CPC ........ G01R 31/3187; G01R 31/318547; G01R 31/318586; G01R 31/31813; G01R 31/318335; G01R 31/318385; G01R 31/318371; G06F 2207/583; G06F 7/584
See application file for complete search history.

(56) References Cited

U.S. PATENT DOCUMENTS

| | | |
|---|---|---|
| 6,327,687 B1 | 12/2001 | Rajski et al. |
| 6,353,842 B1 | 3/2002 | Rajski et al. |
| 6,539,409 B2 | 3/2003 | Rajski et al. |
| 6,543,020 B2 | 4/2003 | Rajski et al. |

(Continued)

OTHER PUBLICATIONS

C. I. H. Chen and K. George, "Configurable two-dimensional linear feedback shifter registers for deterministic and random patterns [logic BIST]," Circuits and Systems, 2003. ISCAS '03. Proceedings of the 2003 International Symposium on, 2003, pp. V-521-V-524 vol. 5.*

(Continued)

*Primary Examiner* — Cynthia Britt

(57) ABSTRACT

Various aspects of the disclosed technology relate to deterministic built-in self-test. A deterministic built-in self-test system comprises: a decompressor configured at least to decompress one of compressed test patterns stored on chip for a predetermined number of times; and a controller configured at least to output a control signal that inverts outputs of the decompressor at one or more scan shift clock cycles based on control data stored on chip, enabling the system to output the predetermined number of test patterns based on the one of compressed test patterns, wherein the one or more scan shift clock cycles are different for each of the predetermined number of test patterns.

20 Claims, 8 Drawing Sheets

(56) References Cited

U.S. PATENT DOCUMENTS

| | | | |
|---|---|---|---|
| 6,557,129 | B1 | 4/2003 | Rajski et al. |
| 6,684,358 | B1 | 1/2004 | Rajski et al. |
| 6,708,192 | B2 | 3/2004 | Rajski et al. |
| 6,829,740 | B2 | 12/2004 | Rajski et al. |
| 6,874,109 | B1 | 3/2005 | Rajski et al. |
| 7,093,175 | B2 | 8/2006 | Rajski et al. |
| 7,111,209 | B2 | 9/2006 | Rajski et al. |
| 7,260,591 | B2 | 8/2007 | Rajski et al. |
| 7,263,641 | B2 | 8/2007 | Rajski et al. |
| 7,478,296 | B2 | 1/2009 | Rajski et al. |
| 7,493,540 | B1 | 2/2009 | Rajski et al. |
| 7,500,163 | B2 | 3/2009 | Rajski et al. |
| 7,506,232 | B2 | 3/2009 | Rajski et al. |
| 7,509,546 | B2 | 3/2009 | Rajski et al. |
| 7,523,372 | B2 | 4/2009 | Rajski et al. |
| 7,653,851 | B2 | 1/2010 | Rajski et al. |
| 2003/0229834 | A1* | 12/2003 | Cooke .............. G01R 31/31833 714/726 |
| 2006/0020862 | A1* | 1/2006 | Kang .............. G01R 31/318544 714/726 |
| 2006/0156131 | A1* | 7/2006 | Kang .............. G01R 31/318547 714/733 |
| 2008/0235544 | A1* | 9/2008 | Lai ................. G01R 31/318547 714/729 |

OTHER PUBLICATIONS

A. A. Al-Yamani, S. Mitra and E. J. McCluskey, "Optimized reseeding by seed ordering and encoding," in IEEE Transactions on Computer-Aided Design of Integrated Circuits and Systems, vol. 24, No. 2, pp. 264-270, Feb. 2005.*

P. Fiser, "Pseudo-Random Pattern Generator Design for Column-Matching BIST," 10th Euromicro Conference on Digital System Design Architectures, Methods and Tools (DSD 2007), Lubeck, 2007, pp. 657-663.*

A.Jas et al., in "Weighted pseudorandom hybrid BIST," vol. 12, pp. 1277-1283, Dec. 2004.

A.-W. Hakmi et al., in "Programmable deterministic built-in self-test," Proc. ITC, 2007, paper 18.1.

D. Das et al., in "Reducing test data volume using external/LBIST hybrid test patterns," Proc. ITC, 2000, pp. 115-122.

K.-H. Tsai et al., in "Star test: the theory and its applications," vol. 19, pp. 1052-1064, Sep. 2000.

N.A. Touba, "Survey of test vector compression techniques," IEEE Design & Test, vol. 23, pp. 294-303, 2006.

R. Kapur, S. Mitra, and T.W. Williams, "Historical perspective on scan compression," IEEE Design & Test, vol. 25, No. 2, pp. 114-120, 2008.

J. Rajski, J. Tyszer, M. Kassab, and N. Mukherjee, "Embedded deterministic test,".

* cited by examiner

Flow chart 700

DETERMINISTIC BUILT-IN SELF-TEST BASED ON COMPRESSED TEST PATTERNS STORED ON CHIP AND THEIR DERIVATIVES

RELATED APPLICATIONS

This application claims the benefit of U.S. Provisional Patent Application No. 62/119,943, filed on Feb. 24, 2015, and naming Grzegorz Mrugalski et al. as inventors, which application is incorporated entirely herein by reference.

FIELD OF THE DISCLOSED TECHNOLOGY

The presently disclosed technology relates to the field of circuit testing. Various implementations of the disclosed technology may be particularly useful for deterministic built-in self-test.

BACKGROUND OF THE DISCLOSED TECHNOLOGY

Ensuring reliable and high quality microelectronics products has remained the primary objective of semiconductor test for years. Successive technology nodes, design characteristics, design processes and other factors have caused an evolution of test schemes. New types of defects and patterns inevitably pose the questions of how sustainable current test schemes are and what matching design-for-test (DFT) methods may soon be needed. For example, it is unclear whether test data compression—the industry-proven mainstream DFT methodology of the last decade—will be capable of coping with the rapid rate of technological changes and the resultant test challenges. Interestingly, logic built-in self-test (LBIST), originally developed for board, system, and infield test, is now often used with test compression. This hybrid approach allows LBIST to rival the best manufacturing test techniques by providing the abilities to run at-speed power-aware tests and to reduce the test cost while preserving or augmenting LBIST and scan compression advantages.

Classical LBIST applications include detecting infant mortality defects during burn-in test or enabling the use of low-cost and/or low-speed testers that only provide power and clock signals. With a mass market driving automotive, mobile or healthcare systems, however, attempts to overcome the bottleneck of test data bandwidth have made the concept of combining logic BIST and test data compression a vital research and development area. The standard ISO 26262 defining functional safety features for automotive equipment applicable throughout the lifecycle of all electronic and electrical safety-related systems clearly calls for at least 90% single point fault coverage attainable in a very short period of test application time. Furthermore, as radio frequency transceivers are smaller than ever and consume less power, the semiconductor test industry is also embracing the opportunity to incorporate wireless communications into on-chip on-line LBIST solutions that ensure highly reliable device operations throughout their lifespan.

Since LBIST fault coverage can be unacceptably low for a feasible pattern count as compared to deterministic test sets, early BIST schemes employed weighted random patterns (WRP) to deal with the test data volume burden. These patterns bias the input signal probabilities to maximize the likelihood of generating the desired patterns. The WRP storage depends on the number of weight sets needed to achieve acceptable fault coverage. If the volume of stored data is to be reduced, many more test patterns than deterministic tests need to be applied. On the other hand, if test time is of concern, the storage size needs to be increased. One weighted random patterns-based BIST scheme is described by A. Jas et al., in "Weighted pseudorandom hybrid BIST," vol. 12, pp. 1277-1283, December, 2004.

Alternatively, desired test stimuli may be obtained by perturbing pseudorandom vectors. One example is described by A.-W. Hakmi et al., in "Programmable deterministic built-in self-test," Proc. ITC, 2007, paper 18.1.

There also exist hybrid BIST schemes in which deterministic patterns are stored on a tester in a compressed form, and then use the existing BIST infrastructure to perform a vector decompression. These deterministic top-up patterns target random-pattern-resistant faults, or faults that are difficult to be detected by random patterns. One hybrid BIST scheme is described by D. Das et al., in "Reducing test data volume using external/LBIST hybrid test patterns," Proc. ITC, 2000, pp. 115-122.

Instead of using a combination of random test patterns and deterministic patterns or perturbing random test patterns, one can work with clusters of patterns comprising a deterministic parent central vector and its derivatives produced in a random or a deterministic fashion. An example of this approach is the Star-BIST scheme described by K.-H. Tsai et al., in "Star test: the theory and its applications," vol. 19, pp. 1052-1064, September, 2000, which is incorporated herein by reference. In the Star-BIST scheme, each of parent ATPG patterns is subject to selective random flipping of its bits to generate a pattern cluster. The scheme requires complex on-chip test logic whose implementation makes use of scan order, polarity between the neighboring scan cells, control points inserted between them, and a waveform generator. With these features the scan may behave like a ROM capable of encoding several deterministic test vectors.

Challenges remain in developing deterministic BIST schemes that employ simple hardware and offer flexible tradeoffs between test coverage and volume of stored test data while maintaining test time within reasonable limits.

BRIEF SUMMARY OF THE DISCLOSED TECHNOLOGY

Various aspects of the disclosed technology relate to deterministic built-in self-test. In one aspect, there is a system, a decompressor configured at least to decompress one of compressed test patterns stored on chip for a predetermined number of times; and a controller configured at least to output a control signal that inverts outputs of the decompressor at one or more scan shift clock cycles based on control data stored on chip, enabling the system to output the predetermined number of test patterns based on the one of compressed test patterns, wherein the one or more scan shift clock cycles are different for each of the predetermined number of test patterns.

The system may further comprise a storage medium storing the compressed test patterns and the control data. Alternatively, the system may further comprise a first storage medium storing the compressed test patterns; and a second storage medium storing the control data.

The control signal inverts outputs of the decompressor at none of the scan shift clock cycles during the outputting of one of the predetermined number of test patterns. The inverting may be performed at an output side of the decompressor. The decompressor may comprise a phase-shifter and the inverting may be performed by inverting inputs of the phase shifter. The decompressor may further comprise a ring generator.

In another aspect, there are one or more non-transitory computer-readable media storing computer-executable instructions for causing a computer or networked computers to perform a method of creating a deterministic built-in self-test system in a circuit design, the method comprising: generating a decompressor configured at least to decompress one of compressed test patterns stored on chip for a predetermined number of times; and generating a controller configured at least to output a control signal that inverts outputs of the decompressor at one or more scan shift clock cycles based on control data stored on chip, enabling the system to output the predetermined number of test patterns based on the one of compressed test patterns, wherein the one or more scan shift clock cycles are different for each of the predetermined number of test patterns.

In still another aspect, there is a method, comprising: generating a cluster of test patterns based on a set of random-pattern-resistant faults, wherein the cluster of test patterns comprises a parent test pattern and a plurality of child test patterns, the parent test pattern being a deterministic and compressible test pattern, each of the plurality of child test patterns being derived by inverting bits of the parent test pattern corresponding to one or more scan shift clock cycles.

The parent test pattern may be obtained based on merging test cubes generated for several random-pattern-resistant faults in the set of random-pattern-resistant faults. The plurality of child test patterns may be derived by inverting bits of the parent test pattern in successive scan shift clock cycles and each of the plurality of child test patterns differs from the parent test pattern by bits corresponding to one clock cycle. The set of random-pattern-resistant faults may be obtained based on performing fault simulation on a set of pseudo-random test patterns.

The method may further comprise: generating more clusters of test patterns based on the list of random-pattern-resistant faults; and performing fault simulation on the cluster of test patterns and the more clusters of test patterns by using the set of random-pattern-resistant faults to determine clusters of effective test patterns.

Alternatively, the method may further comprise: performing fault simulation on the cluster of test patterns with the set of random-pattern-resistant faults to determine a cluster of effective test patterns; performing fault simulation on the cluster of effective test patterns with a set of targeted faults to determine a new set of random-pattern-resistant faults and a new set of targeted faults, the set of targeted faults comprising the set of random-pattern-resistant faults and easy-to-detect faults; and repeating the generating, the performing on the cluster of test patterns and the performing on the cluster of effective test patterns by using the new set of random-pattern-resistant faults to replace the set of random-pattern-resistant faults and using the new set of targeted faults to replace the set of targeted faults Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose technology. Thus, for example, those skilled in the art will recognize that the disclose technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Figure 1:
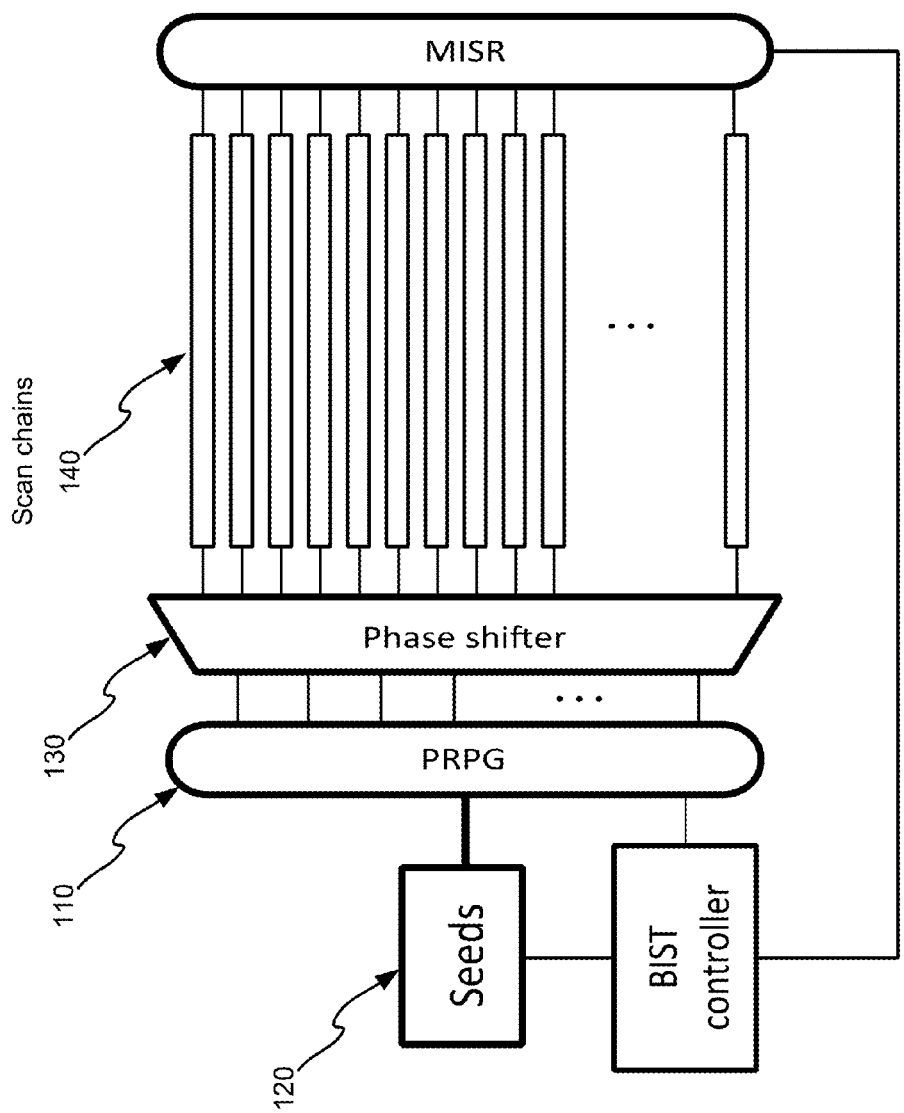
FIG. 1 illustrates the architecture of a basic hybrid BIST scheme.

Various aspects of the disclosed technology relate to deterministic built-in self-test. In the following description, numerous details are set forth for the purpose of explanation. However, one of ordinary skill in the art will realize that the disclosed technology may be practiced without the use of these specific details. In other instances, well-known features have not been described in detail to avoid obscuring the presently disclosed technology.

The detailed description of a method or a device sometimes uses terms like "generate" and "perform" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The disclosed technology relates to deterministic built-in self-test. Built-in self-test (BIST) is a design-for-test methodology that permits a circuit to test itself using embedded test logic. When the circuit-under-test is a logic circuit, the BIST is often referred to as logic built-in self-test (LBIST).

Comparing with traditional automatic test pattern generation (ATPG), traditional LBIST does not rely on pre-computed test patterns to achieve high test coverage. Test stimuli in LBIST are often generated by a pseudo-random pattern generator instead. Examples of pseudo-random pattern generators include linear feedback shift register (LFSR) and cellular automaton (CA).

As discussed previously, BIST logic can be used to handle compressed test patterns that are generated deterministically and stored on chip. Test compression (also referred to as test data compression or scan compression) has become a widely-used technology due to the rising cost of test. This technology involves adding some additional on-chip hardware before and after scan chains. The hardware (decompressor) added before scan chains is configured to decompress test stimulus coming from a tester, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression not only reduces the amount of data stored on the tester, but more importantly, reduces the test time for a given test data bandwidth.

Test patterns are compressible mainly because only 1% to 5% of test pattern bits is typically specified (care) bits. The rest of test pattern bits are don't-cares, which can take on any value with no impact on the fault coverage. A test cube is a deterministic test pattern in which the bits that ATPG does not assign are left as don't-cares (that is, the ATPG does not randomly fill the don't-cares). Test compression may also take advantage of the fact that test cubes tend to be highly correlated. The correlation exists because faults are structurally related in the circuit. Various test compression techniques have been developed.

The embedded deterministic test (EDT) is a test compression scheme. The presently disclosed technology will be described using EDT as an example. It should be appreciated, however, that the disclosed technology can be applied to different test compression schemes. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," *IEEE Trans. CAD*, vol. 23, pp. 776-792, May 2004, and U.S. Pat. Nos. 6,327,687; 6,353, 842; 6,539,409; 6,543,020; 6,557,129; 6,684,358; 6,708, 192; 6,829,740; 6,874,109; 7,093,175; 7,111,209; 7,260, 591; 7,263,641; 7,478,296; 7,493,540; 7,500,163; 7,506, 232; 7,509,546; 7,523,372; 7,653,851, all of which are hereby incorporated herein by reference.

FIG. 1 illustrates the architecture of a basic hybrid BIST scheme. The test typically operates in two steps. First, a pseudorandom pattern generator (PRPG) 110 is run to produce a predetermined number of random stimuli that essentially detect random (or easily) testable faults. The duration of this phase depends on how long it takes to reach certain test coverage or when a test coverage curve enters the diminishing returns area. In order to avoid applying a prohibitively large number of random test patterns, the second step targets the remaining, random resistant, faults by using ATPG patterns whose compressed forms are stored on chip in a dedicated seeds memory 120. It is worth noting that the same hardware—PRPG 110 and the associated phase shifter 130—can now be reused as a decompressor to decompress test cubes and to feed scan chains 140 provided some sequential test compression, such as the LFSR (linear feedback shift register) reseeding, is deployed. These tests are often reordered to reduce their quantity and to enable a faster test coverage ramp-up. In BIST-ready designs, it is also a common practice to employ test points which are inserted into the circuit under test to increase observability and controllability of critical areas of the circuit so that faults in these areas can be detected by pseudorandom test patterns.

The scheme of FIG. 1 can offer tests of good quality with the fast test coverage ramp-up and attractive trade-offs between test application time and test data volume (or alternatively on-chip test logic area). However, in ultra-large-scale designs, these two factors become serious constraints on the hybrid BIST applicability. This is because decreasing the size of the on-chip test data memory may lead to a long test time due to the number of random stimuli visibly elevated above what would be considered acceptable. On the other hand, stringent requirements regarding the test time inevitably result in a sizeable test memory.

Two observations may be exploited to develop a deterministic built-in self-test scheme. First, some particular clusters of test patterns can detect many random pattern resistant faults, as reported in K.-H. Tsai, J. Rajski, and M. Marek-Sadowska, "Star test: the theory and its applications," IEEE Trans. CAD, vol. 19, pp. 1052-1064, September 2000, which is incorporated herein by reference. Typically, a cluster consists of a parent pattern and several children vectors derived from it through simple transformations. Consider a test pattern T that detects a stuck-at-0 fault at the output of an n-input AND gate (tree-like structures whose functionality is equivalent to AND or OR gates with a large fan-in are commonly employed in real and complex designs). This test pattern sets all gate inputs to 1 (for large n, it would be difficult to do it randomly). Now, test patterns that detect stuck-at-1 faults at the same gate inputs have the Hamming distance of 1 to T. Clearly, T is a good parent pattern as it allows one to derive n additional tests through single-bit flipping of its successive components.

Figure 2:
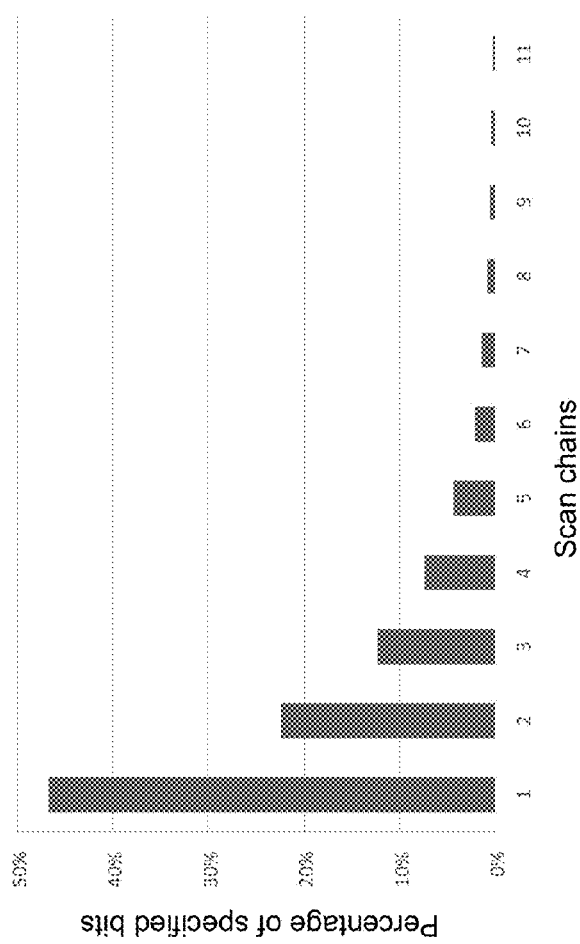
FIG. 2 illustrates distribution of specified bits within test cubes for one industrial design.

Second, a single scan chain typically hosts the vast majority of specified bits of a given test cube. Although this phenomenon is to a large extent dependent on the scan chain stitching method and the actual scan architecture, it nevertheless appears to be the case across many designs since forming scan chains takes into account the actual design layout as well as clock and power distribution networks. FIG. 2 illustrates distribution of specified bits within test cubes for one industrial design. The first bar (1) indicates the fraction, averaged over all test cubes, of specified bits that end up in the most populated scan chain. The next bar (2)

denotes the percentage of specified bits hosted by the second-most populated scan chain, and so on. As can be seen, on average, a single scan chain hosts 45% of all specified bits of a given test cube, whereas the second-most popular chain, for a single test cube, provides locations for less than half of this quantity. All presented data were collected for test cubes containing at least 4 specified bits.

Based on the above two observations, a deterministic built-in self-test scheme may generate a cluster of test patterns by complementing (e.g., inverting or flipping), bits (e.g., all bits) associated with one or more time frames (e.g., one or more scan shift clock cycles). In particular, if bits associated with only a single time frame are inverted to derive a child test pattern, most likely only a single specified bit of a given test cube is to be affected. After merging compatible test cubes into a test pattern that can be encoded, one can arrive with a selection of shift cycles during which complementing the content of the scan chains—one or more times per pattern—may produce a group of additional and valuable stimuli. These test patterns, due to a slight departure from the original parent pattern, detect many faults that otherwise would need to be targeted separately.

Figure 3:
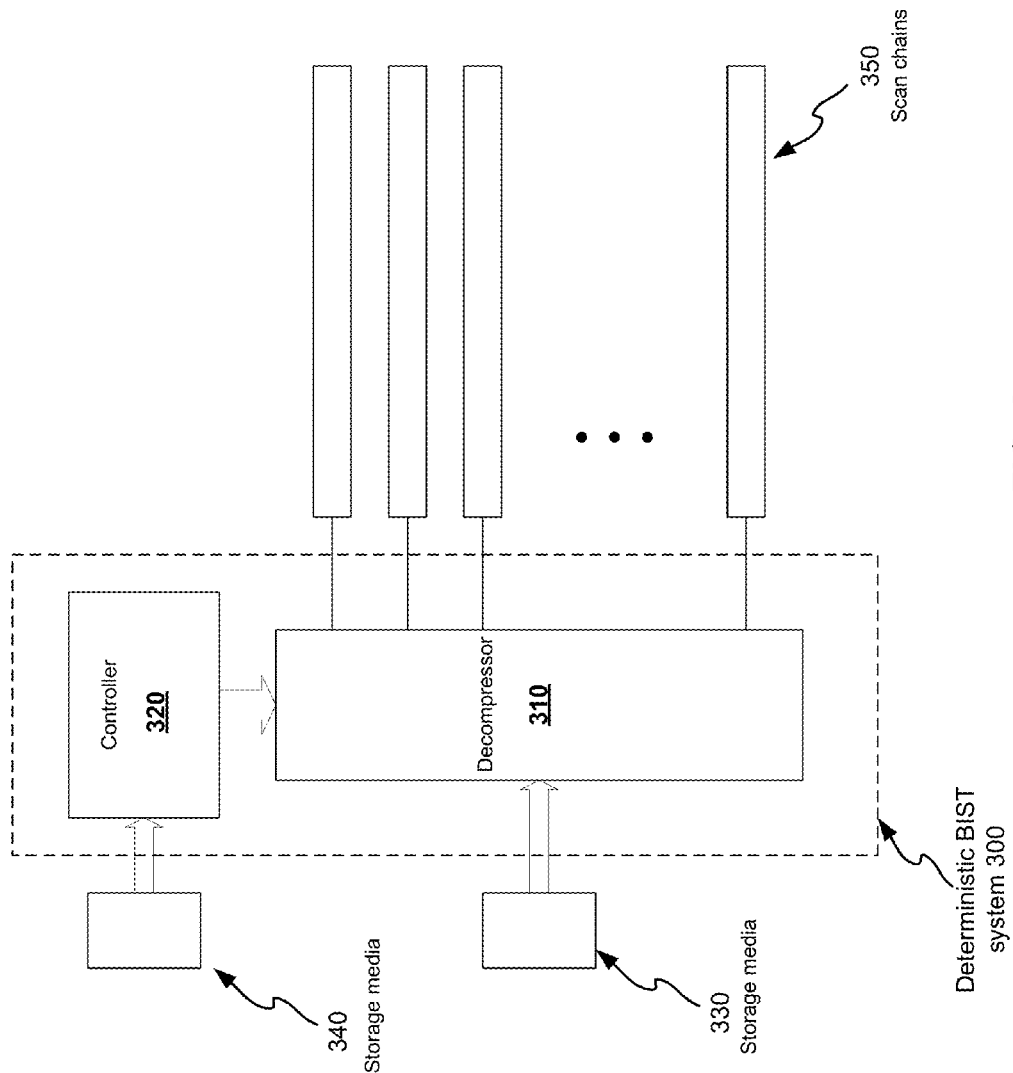
FIG. 3 illustrates an example of a deterministic built-in self-test system for that may be used to implement various embodiments of the disclosed technology.

FIG. 3 illustrates an example of a deterministic built-in self-test system for that may be used to implement various embodiments of the disclosed technology. The deterministic built-in self-test system 300 comprises a decompressor 310 configured to decompress one of compressed test patterns stored on chip for a predetermined number of times and a controller 320 configured to invert outputs of the decompressor 310 at one or more predetermined scan shift clock cycles based on control data stored on chip. The system 300 can generate a cluster of test patterns from one compressed test pattern. Each of the child test patterns differs from the parent test pattern by bits corresponding to one or more predetermined scan shift clock cycles.

The compressed test patterns may be stored in a storage medium 330 and the control data may be stored in another storage medium 340. While the storage media 330 and 340 are shown as separate units in FIG. 3, a single data storage medium may be used to implement both. Also shown in the figure are scan chains 350 where decompressed test stimuli are shifted in and launched to test the circuit-under-test (not shown) and where test responses are collected and shifted out.

Figure 4:
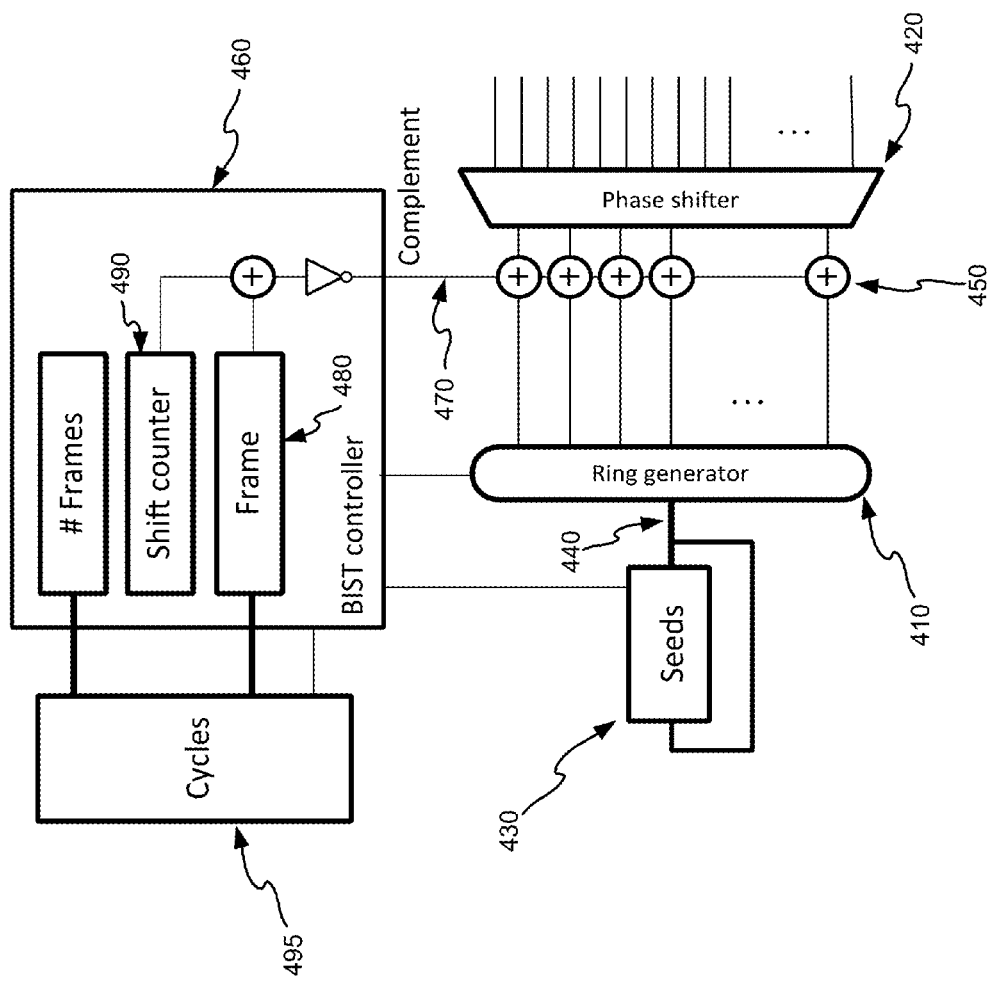
FIG. 4 illustrates an example of a detailed implementation of the system 310.

FIG. 4 illustrates an example of a detailed implementation of the system 310. As can be seen in the figure, an n-bit ring generator 410 and a phase shifter 420 make up a sequential test data decompressor feeding scan chains. The ring generator 410 receives compressed test data from an on-chip seeds memory 430 through a number of input injectors 440. Furthermore, n two-input XOR gates 450 are placed between the ring generator 410 and the phase shifter 420. All of the two-input XOR gates 450 are controlled by a complement signal 470 coming from a BIST controller 460. When it is asserted, outputs of the ring generator 410 are inverted before reaching the phase shifter 420. Typically, the phase shifter feeds every scan chain by means of a 3-input XOR gate. Hence, inverting all phase shifter inputs complements all phase shifter outputs. As a result, setting the complement signal 470 to 1 while decompressing a test pattern causes all bits of a given cycle to flip.

The BIST controller 460 decides, based on the content of an additional frame register 480, when to enable the complement signal. Whenever the content of the frame register 480 matches a shift counter 490 (the inherent part of any BIST circuitry), the complement signal 470 is set to 1 for a single cycle period. A scan shift clock cycle is selected if the resultant test pattern is capable of detecting additional faults. Each of the parent pattern seeds may be assigned a list of effective time frames (cycles). The BIST controller 460 applies a parent pattern seed to the ring generator 410 multiple times. During each of the times a parent pattern seed is applied, bits corresponding to a single scan shift clock cycle are inverted. This is done in a deterministic manner by using the frame register 480 storing a cycle to be complemented for the current test pattern application. The frame register 480 receives a new content from the list of effective cycles kept in another on-chip memory 495.

Figure 5:
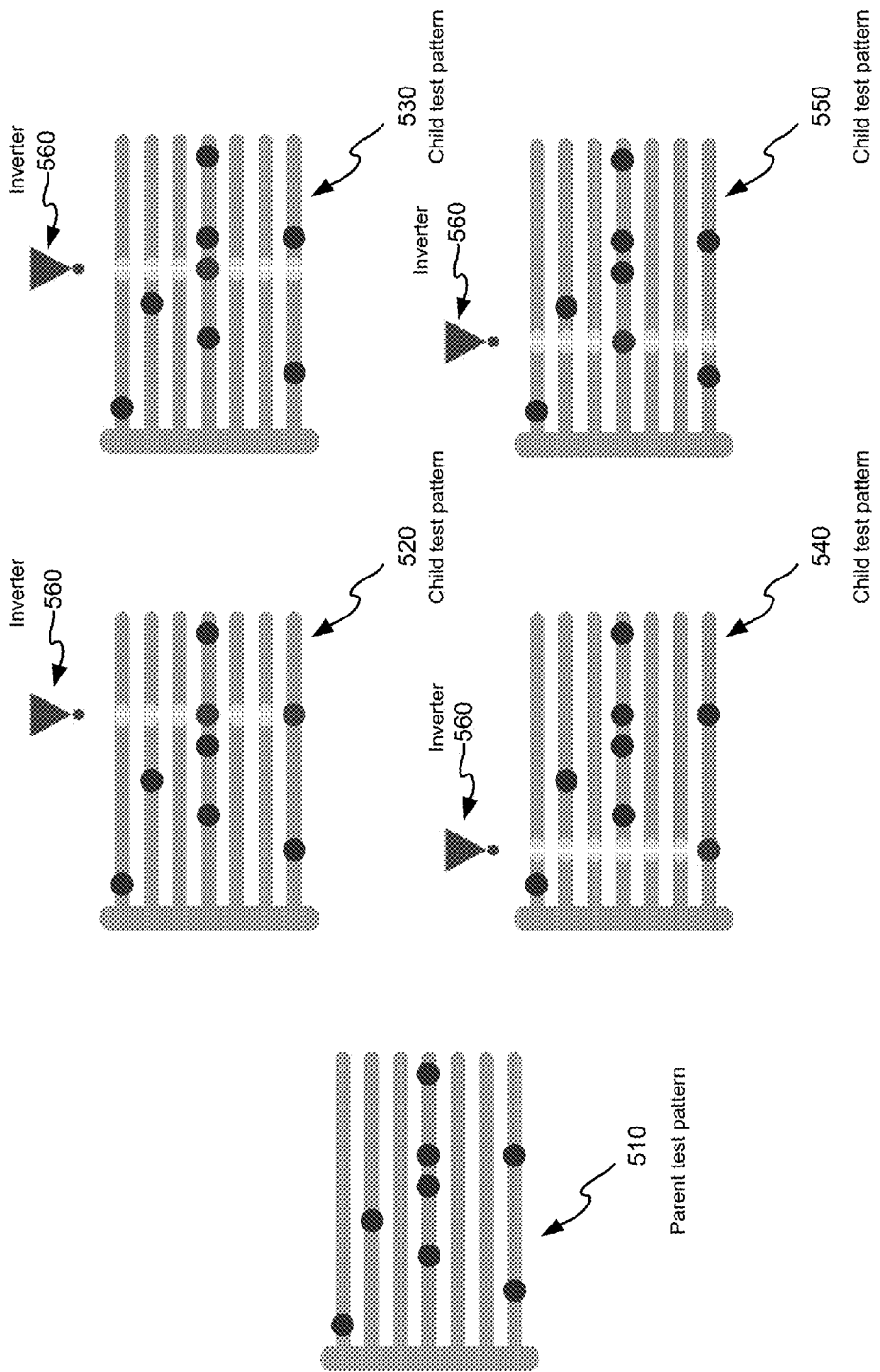
FIG. 5 illustrates an example of a parent test pattern along with four child test patterns that may be outputted by the system shown in FIG. 4 based on a single seed.

FIG. 5 illustrates an example of a parent test pattern 510 along with four child test patterns 520-550 that may be output by the system shown in FIG. 4 based on a single seed. In the figure, the black solids circles represent specified bits for the parent test pattern 510. The inverter 560 at each of the child test patterns indicates the location corresponding to the scan shift clock cycle where bits are inverted.

It should be appreciated that bits corresponding to multiple scan shift clock cycles may be inverted for a child test pattern in some embodiments of the disclosed technology. It should also be appreciated that other methods may be used to invert bits corresponding to a scan shift clock cycle. For example, rather than doing it inside the decompressor, the inversion may be performed at the outputs of the decompressor.

Some of the technology described herein can be implemented in software instructions stored on a computer-readable medium, software instructions executed on a computer, or some combination of both. Some of the disclosed technology, for example, can be implemented as part of an electronic design automation (EDA) tool (e.g., design for testing (DFT) tool). The tool includes software instructions causing a computer or networked computers to perform a method of creating a deterministic built-in self-test system in a circuit design, the method comprising: generating a decompressor configured at least to decompress one of compressed test patterns stored on chip for a predetermined number of times; and generating a controller configured at least to output a control signal that inverts outputs of the decompressor at one or more scan shift clock cycles based on control data stored on chip, enabling the system to output the predetermined number of test patterns based on the one of compressed test patterns, wherein the one or more scan shift clock cycles are different for each of the predetermined number of test patterns.

The device generation may comprise inserting an HDL or gate-level netlist description of a testing device such as a decompressor into the circuit design. The DFT tool may also convert some of the functional devices in the original circuit design into dual-purpose devices. For example, flip-flops may serve as scan cells in the test mode and registers in the functional mode.

Figure 6:
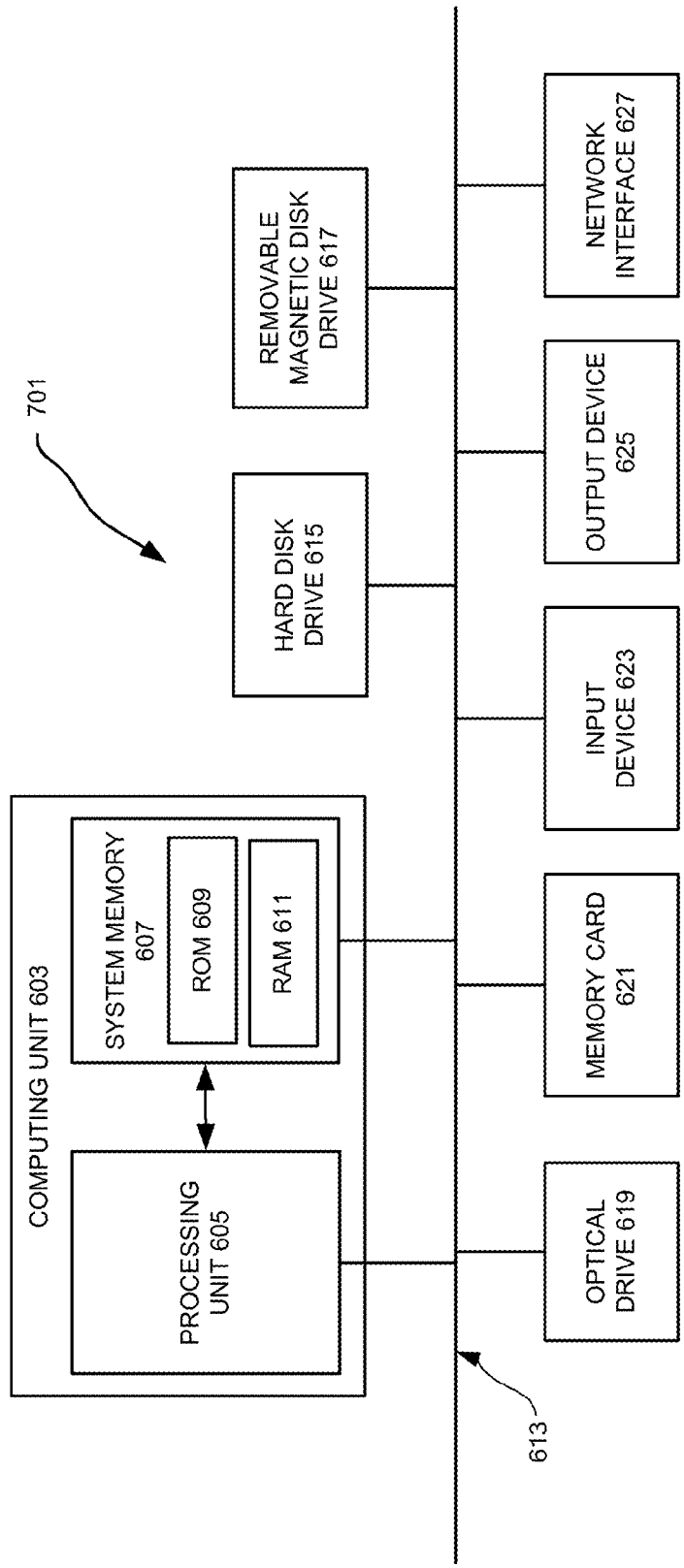
FIG. 6 illustrates a programmable computer system with which various embodiments of the disclosed technology may be employed.

Saving only parent pattern seeds and associated complement scan shift clock cycles can save a considerable amount of chip area. The reduction in on-chip test memory size comes at a price of customizing test generation and test ordering processes. Various embodiments of the disclosed technology related to generating and ordering compressed test patterns for the testing scheme described above may be implemented through the execution of software instructions by a computing device, such as a programmable computer. FIG. 6 shows an illustrative example of such a programmable computer (a computing device 601). As seen in this figure, the computing device 601 includes a computing unit 603 with a processing unit 605 and a system memory 607. The processing unit 605 may be any type of programmable electronic device for executing software instructions, but will conventionally be a microprocessor. The system memory 607 may include both a read-only memory (ROM) 609 and a random access memory (RAM) 611. As will be appreciated by those of ordinary skill in the art, both the read-only memory (ROM) 609 and the random access memory (RAM) 611 may store software instructions for execution by the processing unit 605.

The processing unit 605 and the system memory 607 are connected, either directly or indirectly, through a bus 613 or alternate communication structure, to one or more peripheral devices. For example, the processing unit 605 or the system memory 607 may be directly or indirectly connected to one or more additional memory storage devices, such as a "hard" magnetic disk drive 615, a removable magnetic disk drive 617, an optical disk drive 619, or a flash memory card 621. The processing unit 605 and the system memory 607 also may be directly or indirectly connected to one or more input devices 623 and one or more output devices 625. The input devices 623 may include, for example, a keyboard, a pointing device (such as a mouse, touchpad, stylus, trackball, or joystick), a scanner, a camera, and a microphone. The output devices 625 may include, for example, a monitor display, a printer and speakers. With various examples of the computer 601, one or more of the peripheral devices 615-625 may be internally housed with the computing unit 603. Alternately, one or more of the peripheral devices 615-625 may be external to the housing for the computing unit 603 and connected to the bus 613 through, for example, a Universal Serial Bus (USB) connection.

With some implementations, the computing unit 603 may be directly or indirectly connected to one or more network interfaces 627 for communicating with other devices making up a network. The network interface 627 translates data and control signals from the computing unit 603 into network messages according to one or more communication protocols, such as the transmission control protocol (TCP) and the Internet protocol (IP). Also, the interface 627 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 601 is illustrated as an example only, and it not intended to be limiting. Various embodiments of the disclosed technology may be implemented using one or more computing devices that include the components of the computer 601 illustrated in FIG. 6, which include only a subset of the components illustrated in FIG. 6, or which include an alternate combination of components, including components that are not shown in FIG. 6. For example, various embodiments of the disclosed technology may be implemented using a multi-processor computer, a plurality of single and/or multiprocessor computers arranged into a network, or some combination of both.

Some other embodiments of the disclosed technology may be implemented by software instructions, stored on one or more non-transitory computer-readable media, for causing one or more processors to create a design of the integrated circuit such as the one shown in FIG. 4. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

Figure 7:
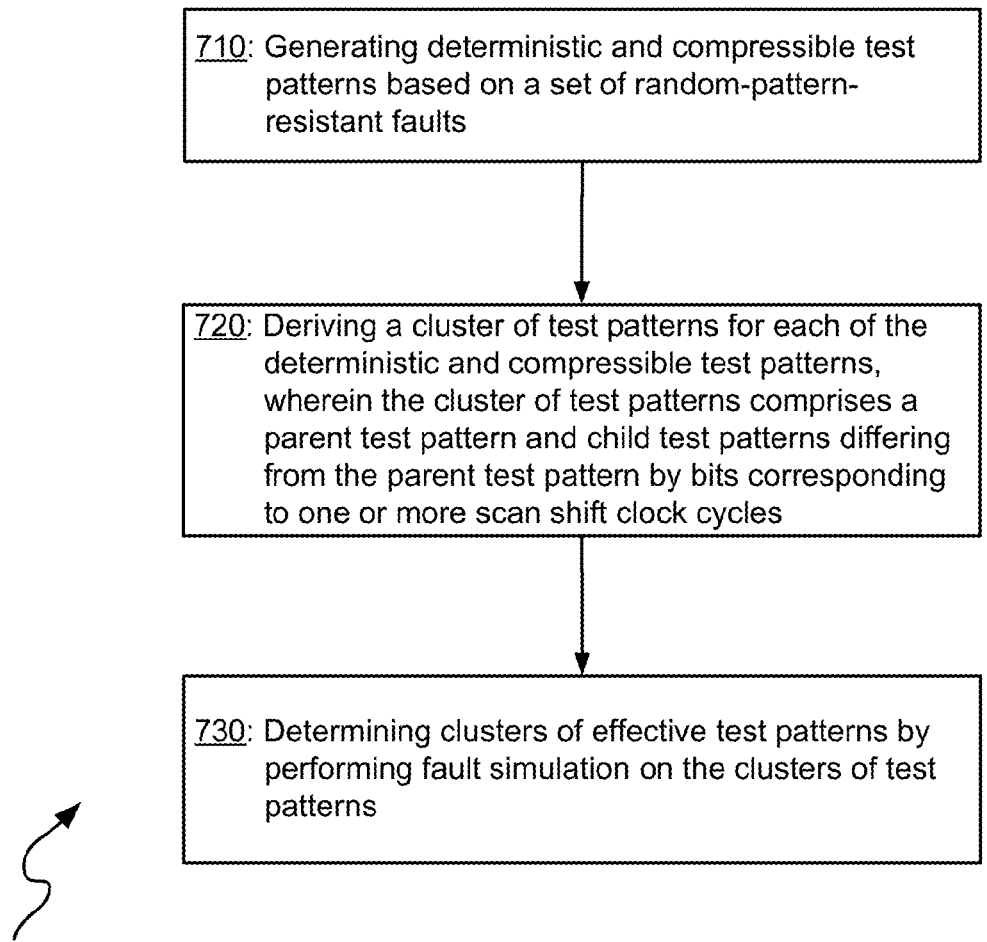
FIG. 7 illustrates a flowchart describing an example process for generating parent pattern seeds and associated complement scan shift clock cycles for deterministic BIST that may be employed by various embodiments of the disclosed technology.

FIG. 7 illustrates a flowchart 700 describing an example process for generating parent pattern seeds and associated complement scan shift clock cycles for deterministic BIST that may be employed by various embodiments of the disclosed technology. Initially, in operation 710, deterministic and compressible test patterns are generated based on a set of random-pattern-resistant faults. The set of random-pattern-resistant faults may be obtained by fault simulating a certain number of pseudorandom stimuli. The fault simulation may first derive easy-to-detect faults. The random-pattern-resistant faults may then be obtained by removing the easy-to-detect faults from the list of fault. Commercial ATPG and compression tools may be employed to derive the deterministic and compressible test patterns.

In operation 720, a cluster of test patterns is derived for each of the compressed test patterns. A cluster of test patterns comprises a parent test pattern and child test patents differing from the parent test pattern by bits corresponding to one or more scan shift clock cycles. If only bits corresponding to a single scan shift clock cycle are inverted to derive each child test pattern, systematically complementing the content of scan chains in successive time frames may be used.

In operation 730, clusters of effective test patterns are determined by performing fault simulation on the clusters of test patterns. One example of a detailed implementation of the operation 730 is as follows: Let $F_c$ be a list of faults covered by a test cluster c. These lists guide a greedy algorithm that orders the test clusters as follows. First, the largest test cluster d, e.g., the one detecting the largest number of faults, is chosen, and faults occurring on list $F_d$ are removed from lists of faults associated with the remaining test clusters. This process is then repeated by selecting the largest cluster in the remaining clusters until there are no non-empty fault lists or there are no test clusters unpicked yet. Finally, all selected clusters are fault simulated again in accordance with the generated order and with fault dropping enabled. This time children patterns that do not cover faults from the corresponding list are filtered out.

The process 700 describes a process of generating test patterns based on random-resistant faults. Typically, however, patterns targeting this type of faults appear to be equally suitable for the remaining ones as they can detect a significant majority of faults that can be detected by pseudorandom stimuli. This is illustrated in Table 1 for four industrial designs.

TABLE 1

| | Test coverage [%] | | |
| --- | --- | --- | --- |
| | EDT | Random patterns | New scheme |
| D1 | 98.87 | 92.17 | 96.13 |
| D2 | 98.67 | 81.97 | 96.79 |
| D3 | 97.81 | 91.01 | 96.71 |
| D4 | 92.30 | 87.46 | 85.20 |

The second column of Table 1 reports the reference single stuck-at fault coverage that is obtained by using the EDT-based test compression flow. The third column lists the resultant test coverage after applying 32,000 purely pseudorandom test patterns. The last column demonstrates coverage yielded at this stage by the deterministic BIST scheme. As can be seen, the difference in coverage between the EDT-based test compression flow and the deterministic BIST scheme (these are faults that require additional patterns) is usually marginal. Only design D4 will require more test generation efforts to close a 7% gap comprising uncovered faults.

To improve the test coverage, the derived test set may be fault simulated by using the list of easy-to-detect faults to determine a small fraction of defects that still escape detection at this point. For this group of faults, the process described in flowchart 700 is repeated until the complete test coverage is reached. As a result, no random patterns are needed, and test application time is dependent on the number of test clusters and the number of individual components they feature.

Figure 8:
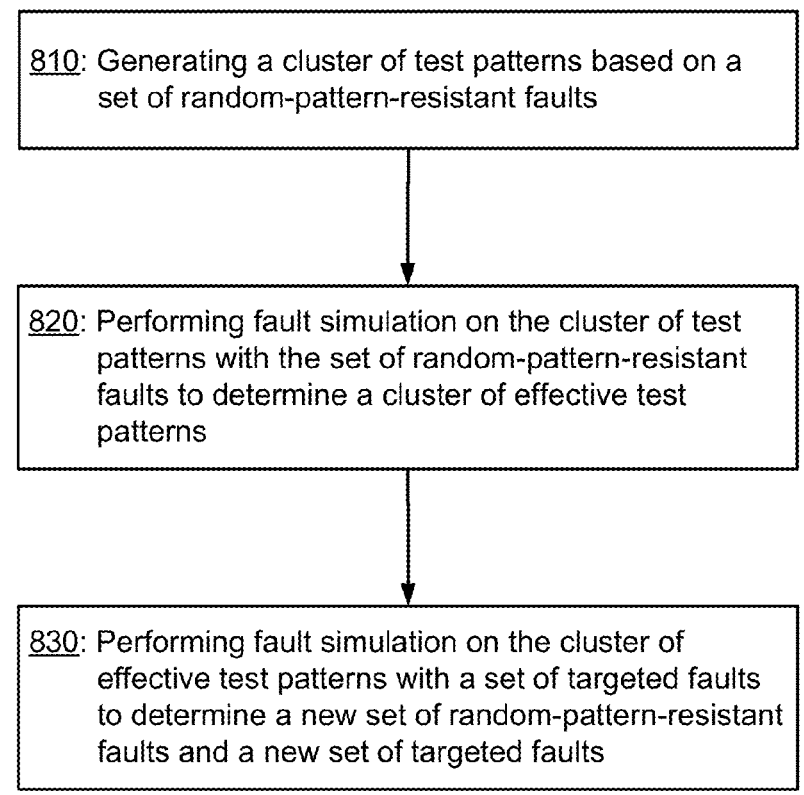
FIG. 8 illustrates a flowchart describing another example process for generating parent pattern seeds and associated complement scan shift clock cycles for deterministic BIST that may be employed by various embodiments of the disclosed technology.

FIG. 8 illustrates a flowchart 800 describing another example process for generating parent pattern seeds and associated complement scan shift clock cycles for deterministic BIST that may be employed by various embodiments of the disclosed technology. In operation 810, a cluster of test patterns is generated based on a set of random-pattern-resistant faults. The set of random-pattern-resistant faults may be determined by fault simulating a certain number of pseudorandom stimuli as previously noted. The parent test pattern may be obtained based on merging test cubes generated for several random-pattern-resistant faults in the set of random-pattern-resistant faults. The test cube generation may be accomplished by using conventional techniques such as those implemented in commercial ATPG and compression tools. Each of the child test patents is derived by inverting bits of the parent test pattern corresponding to one or more scan shift clock cycles. If only bits corresponding to a single scan shift clock cycle are inverted to derive each child test pattern, systematically complementing the content of scan chains in successive time frames may be used.

In operation 820, fault simulation is performed on the cluster of test patterns with the set of random-pattern-resistant faults to determine a cluster of effective test patterns. In this operation, test patterns in the cluster of test patterns that can detect more faults in the set of random-pattern-resistant faults may be kept.

In operation 830, fault simulation is performed on the cluster of effective test patterns with a set of targeted faults to determine a new set of random-pattern-resistant faults and a new set of targeted faults. The set of targeted faults comprises the set of random-pattern-resistant faults and easy-to-detect faults. The operations 810-830 may be repeated until all of the targeted faults are processed.

The following is a pseudo code illustrating an example implementation of the flowchart 800:

```
simulate θ random patterns to get list f of hard faults
repeat
    while list f is not empty do
        generate a parent test pattern
        produce all children patterns
        fault simulate the current test cluster on list f
        save effective patterns
        fault simulate effective patterns on list g
        update lists f and g by removing detected faults
        if g is empty break
    reload f with g
sort test clusters
```

CONCLUSION

While the disclosed technology has been described with respect to specific examples including presently preferred modes of carrying out the disclosed technology, those skilled in the art will appreciate that there are numerous variations and permutations of the above described systems and technology that fall within the spirit and scope of the disclosed technology as set forth in the appended claims. For example, while the embedded deterministic test has been employed to describe the disclosed technology, it should be appreciated that various examples of the disclosed technology may be implemented using any desired test compression schemes.

What is claimed is:

1. A system, comprising:
a decompressor configured at least to decompress one of compressed test patterns stored on chip for a predetermined number of times; and
a controller configured at least to output a control signal based on control data stored on chip, outputs of the decompressor being inverted at one or more scan shift clock cycles based on the control signal which enables the system to output the predetermined number of test patterns based on the one of compressed test patterns, wherein the one or more scan shift clock cycles are different for each of the predetermined number of test patterns.

2. The system recited in claim 1, further comprising:
a storage medium storing the compressed test patterns and the control data.

3. The system recited in claim 1, further comprising:
a first storage medium storing the compressed test patterns; and
a second storage medium storing the control data.

4. The system recited in claim 1, wherein the outputs of the decompressor are inverted at none of the scan shift clock cycles during the outputting of one of the predetermined number of test patterns.

5. The system recited in claim 1, wherein the outputs of the decompressor are inverted at an output side of the decompressor.

6. The system recited in claim 1, wherein the decompressor comprises a phase-shifter and the outputs of the decompressor are inverted by inverting inputs of the phase shifter.

7. The system recited in claim 6, wherein the decompressor further comprises a ring generator.

8. One or more computer-readable media storing computer-executable instructions for causing a computer or networked computers to perform a method of creating a deterministic built-in self-test system in a circuit design, the method comprising:
generating a decompressor configured at least to decompress one of compressed test patterns stored on chip for a predetermined number of times; and
generating a controller configured at least to output a control signal based on control data stored on chip, outputs of the decompressor being inverted at one or more scan shift clock cycles based on the control signal which enables the system to output the predetermined number of test patterns based on the one of compressed test patterns, wherein the one or more scan shift clock cycles are different for each of the predetermined number of test patterns.

9. The one or more computer-readable media recited in claim 8, wherein the compressed test patterns and the control data are stored on a storage medium.

10. The one or more computer-readable media recited in claim 8, wherein the compressed test patterns are stored on a first storage medium storing and the control data are stored on a second storage medium.

11. The one or more computer-readable media recited in claim 8, wherein the outputs of the decompressor are inverted at none of the scan shift clock cycles during the outputting of one of the predetermined number of test patterns.

12. The one or more computer-readable media recited in claim 8, wherein the outputs of the decompressor are inverted at an output side of the decompressor.

13. The one or more computer-readable media recited in claim 8, wherein the decompressor comprises a phase-shifter and the outputs of the decompressor are inverted by inverting inputs of the phase shifter.

14. The one or more computer-readable media recited in claim 13, wherein the decompressor further comprises a ring generator.

15. A method, executed by at least one processor of a computer, comprising:
    generating a cluster of test patterns based on a set of random-pattern-resistant faults, wherein the cluster of test patterns comprises a parent test pattern and a plurality of child test patterns, the parent test pattern being a deterministic and compressible test pattern, each of the plurality of child test patterns being derived by inverting bits of the parent test pattern corresponding to one or more scan shift clock cycles.

16. The method recited in claim 15, wherein the parent test pattern is obtained based on merging test cubes generated for several random-pattern-resistant faults in the set of random-pattern-resistant faults.

17. The method recited in claim 15, wherein the plurality of child test patterns are derived by inverting bits of the parent test pattern in successive scan shift clock cycles and each of the plurality of child test patterns differs from the parent test pattern by bits corresponding to one clock cycle.

18. The method recited in claim 15, further comprising:
    generating more clusters of test patterns based on the list of random-pattern-resistant faults; and
    performing fault simulation on the cluster of test patterns and the more clusters of test patterns by using the set of random-pattern-resistant faults to determine clusters of effective test patterns.

19. The method recited in claim 15, further comprising:
    performing fault simulation on the cluster of test patterns with the set of random-pattern-resistant faults to determine a cluster of effective test patterns;
    performing fault simulation on the cluster of effective test patterns with a set of targeted faults to determine a new set of random-pattern-resistant faults and a new set of targeted faults, the set of targeted faults comprising the set of random-pattern-resistant faults and easy-to-detect faults; and
    repeating the generating, the performing on the cluster of test patterns and the performing on the cluster of effective test patterns by using the new set of random-pattern-resistant faults to replace the set of random-pattern-resistant faults and using the new set of targeted faults to replace the set of targeted faults.

20. The method recited in claim 15, wherein the set of random-pattern-resistant faults is obtained based on performing fault simulation on a set of pseudo-random test patterns.

* * * * *